(12) United States Patent
Masuda et al.

(10) Patent No.: US 11,420,832 B2
(45) Date of Patent: Aug. 23, 2022

(54) TRANSPORT FIXING JIG

(71) Applicant: NITTO DENKO CORPORATION, Ibaraki (JP)

(72) Inventors: Shotaro Masuda, Ibaraki (JP); Tomoaki Ichikawa, Ibaraki (JP); Yohei Maeno, Ibaraki (JP); Yoshiharu Hatakeyama, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 778 days.

(21) Appl. No.: 16/084,628

(22) PCT Filed: Mar. 14, 2017

(86) PCT No.: PCT/JP2017/010140
§ 371 (c)(1),
(2) Date: Sep. 13, 2018

(87) PCT Pub. No.: WO2017/159661
PCT Pub. Date: Sep. 21, 2017

(65) Prior Publication Data
US 2019/0071265 A1    Mar. 7, 2019

(30) Foreign Application Priority Data

Mar. 18, 2016   (JP) .............................. JP2016-055245
Mar. 10, 2017   (JP) .............................. JP2017-046313

(51) Int. Cl.
*B32B 9/04*          (2006.01)
*B65G 49/07*        (2006.01)
(Continued)

(52) U.S. Cl.
CPC ................ *B65G 49/07* (2013.01); *B32B 5/02* (2013.01); *B32B 7/12* (2013.01); *H01L 21/677* (2013.01);
(Continued)

(58) Field of Classification Search
CPC .... B65G 49/07; C09J 2400/12; H01L 21/677; H01L 21/6835
See application file for complete search history.

(56) References Cited

U.S. PATENT DOCUMENTS 6,737,951 B1    5/2004   Decristofaro et al.
7,482,249 B2    1/2009   Jakob et al.
(Continued)

FOREIGN PATENT DOCUMENTS

JP    63-299131 A    12/1988
JP    5-11386 U       2/1993
(Continued)

OTHER PUBLICATIONS

Extended European Search Report dated Jul. 19, 2019, from the European Patent Office in counterpart European Application No. 17766660.9.
(Continued)

*Primary Examiner* — Zachary M Davis
(74) *Attorney, Agent, or Firm* — Sughrue Mion, PLLC

(57) ABSTRACT

Provided is a transport fixing jig that has a high gripping force, hardly contaminates an object to be processed (object to be transported), and is excellent in heat resistance. The transport fixing jig of the present invention includes: a first base material; a carbon nanotube aggregate; and an adhesive layer arranged between the first base material and the carbon nanotube aggregate, wherein the first base material and the carbon nanotube aggregate are bonded to each other via the adhesive layer, and wherein a ratio (adhesive layer/base material) between a linear expansion coefficient of the first base material and a linear expansion coefficient of the adhesive layer is from 0.7 to 1.8.

9 Claims, 2 Drawing Sheets

(51) Int. Cl.
  *H01L 21/673* (2006.01)
  *H01L 21/687* (2006.01)
  *B32B 5/02* (2006.01)
  *B32B 7/12* (2006.01)
  *H01L 21/677* (2006.01)
  *H01L 21/683* (2006.01)

(52) U.S. Cl.
  CPC .... *H01L 21/67316* (2013.01); *H01L 21/6835* (2013.01); *H01L 21/68707* (2013.01); *B32B 2255/20* (2013.01); *B32B 2262/106* (2013.01)

(56) References Cited

U.S. PATENT DOCUMENTS

| | | | |
|---|---|---|---|
| 10,137,576 | B2 | 11/2018 | Gilchrist et al. |
| 10,556,351 | B2 | 2/2020 | Gilchrist et al. |
| 2004/0085173 | A1 | 5/2004 | Decristofaro et al. |
| 2012/0107597 | A1* | 5/2012 | Kim .................. B82Y 30/00 428/292.1 |
| 2012/0247237 | A1 | 10/2012 | Ishibashi et al. |
| 2012/0258275 | A1* | 10/2012 | Maeno .................. C01B 32/16 428/95 |
| 2014/0301818 | A1* | 10/2014 | Gilchrist ............. H01L 21/6875 414/744.2 |
| 2017/0271193 | A1 | 9/2017 | Maeno |
| 2019/0160690 | A1 | 5/2019 | Gilchrist et al. |
| 2020/0180163 | A1 | 6/2020 | Gilchrist et al. |

FOREIGN PATENT DOCUMENTS

| | | | |
|---|---|---|---|
| JP | 5-133503 | A | 5/1993 |
| JP | 9-48133 | A | 2/1997 |
| JP | 11-251042 | A | 9/1999 |
| JP | 2000-58406 | A | 2/2000 |
| JP | 2001-351961 | A | 12/2001 |
| JP | 2004-127737 | A | 4/2004 |
| JP | 2010-263238 | A | 11/2010 |
| JP | 2012-211868 | A | 11/2012 |
| JP | 2013-036963 | A | 2/2013 |
| JP | 2013-138152 | A | 7/2013 |
| JP | 2013-208881 | A | 10/2013 |
| JP | 2014-116562 | A | 6/2014 |
| JP | 2015-018228 | A | 1/2015 |
| JP | 2015-184084 | A | 10/2015 |
| KR | 10-2014-0109953 | A | 9/2014 |
| KR | 10-2017-0048336 | A | 5/2017 |
| TW | 200910511 | A | 3/2009 |
| WO | 2008/152940 | A1 | 12/2008 |
| WO | 2016/027600 | A1 | 2/2016 |

OTHER PUBLICATIONS

International Search Report of PCT/JP2017/010140 dated Jun. 13, 2017.
Notification of Reason for Refusal dated Dec. 20, 2021, issued by the Korean Intellectual Property Office in application No. 10-2018-7026540.
Notification of Reasons for Refusal dated Jun. 9, 2021 from the Korean Intellectual Property Office in Application No. 10-2018-7026540.
Notice of Reasons for Refusal dated Oct. 5, 2021 from the Japanese Patent Office in Application No. 2017-046313.
Decision of Refusal dated Apr. 26, 2022 in Japanese Application No. 2017-046313.
Office Action dated May 30, 2022 from the Taiwanese Intellectual Property Office in TW Application No. 106108683.

* cited by examiner

TRANSPORT FIXING JIG

CROSS REFERENCE TO RELATED APPLICATIONS

This application is a National Stage of International Application No. PCT/JP2017/010140 filed Mar. 14, 2017, claiming priority based on Japanese Patent Application No. 2016-055245 filed Mar. 18, 2016 and Japanese Patent Application No. 2017-046313 filed Mar. 10, 2017.

TECHNICAL FIELD

The present invention relates to a transport fixing jig.

BACKGROUND ART

In transporting a material, a production intermediate, a product, or the like (hereinafter sometimes referred to as "object to be processed") in a manufacturing process for a semiconductor device or the like, the object to be processed is transported through use of a carrying member, such as a movable arm or a movable table (see, for example, Patent Literatures 1 and 2). In such transport, there is a demand for a member on which the object to be processed is to be mounted (transport fixing jig) to have such a strong gripping force as to prevent the object to be processed from shifting in position while being transported. In addition, such demand has increased year by year along with a demand for a faster manufacturing process.

However, in a related-art transport fixing jig, there is a problem in that the object to be processed is held by an elastic material, such as a resin, and hence the elastic material is liable to adhere to and remain on the object to be processed. In addition, there is a problem in that the elastic material, such as a resin, has low heat resistance, and hence the gripping force of the jig is reduced under a high-temperature environment.

When a material such as ceramics is used for the transport fixing jig, contamination of the object to be processed is prevented, and temperature dependence of a gripping force is reduced. However, a transport fixing jig formed of such material involves a problem of inherently having a weak gripping force, and thus being unable to sufficiently hold the object to be processed even at normal temperature.

In addition, a method of holding the object to be processed under a high-temperature environment is, for example, a method involving adsorbing the object to be processed under reduced pressure, or a method involving fixing the object to be processed by the shape of a transport fixing jig (e.g., chucking or counterbore fixing). However, the method involving adsorbing the object to be processed under reduced pressure is effective only under an air atmosphere, and cannot be adopted under a vacuum in, for example, a CVD step. In addition, the method involving fixing the object to be processed by the shape of the transport fixing jig involves, for example, the following problems. The object to be processed is damaged, or a particle is produced, by contact between the object to be processed and the transport fixing jig.

CITATION LIST

Patent Literature

[PTL 1] JP 2001-351961 A
[PTL 2] JP 2013-138152 A

SUMMARY OF INVENTION

Technical Problem

An object of the present invention is to provide a transport fixing jig that has a high gripping force, hardly contaminates an object to be processed (object to be transported), and is excellent in heat resistance.

Solution to Problem

According to one embodiment of the present invention, there is provided a transport fixing jig, including: a first base material; a carbon nanotube aggregate; and an adhesive layer arranged between the first base material and the carbon nanotube aggregate, wherein the first base material and the carbon nanotube aggregate are bonded to each other via the adhesive layer, and wherein a ratio (adhesive layer/base material) between a linear expansion coefficient of the first base material and a linear expansion coefficient of the adhesive layer is from 0.7 to 1.8.

In one embodiment, the transport fixing jig further includes a second base material, the carbon nanotube aggregate is formed on the second base material, and the first base material and the second base material are bonded to each other via the adhesive layer.

In one embodiment, an adhesive forming the adhesive layer includes an inorganic adhesive or a carbon-based adhesive.

In one embodiment, the inorganic adhesive includes a ceramic adhesive.

In one embodiment, when the transport fixing jig is left to stand under 450° C. for 1 hour, a change in modulus of elasticity of the adhesive layer is 50% or less.

In one embodiment, the adhesive layer has a linear expansion coefficient of from 5 ppm/° C. to 12 ppm/° C.

In one embodiment, a material forming the first base material includes alumina.

In one embodiment, a surface of the carbon nanotube aggregate has a coefficient of static friction against a glass surface at 23° C. of from 1 to 50.

According to another embodiment of the present invention, there is provided a method of producing the transport fixing jig. The production method includes: applying an adhesive onto a first base material to form an applied layer; arranging a carbon nanotube aggregate on the applied layer; curing the applied layer to form an adhesive layer; and bonding the first base material and the carbon nanotube aggregate to each other via the adhesive layer, wherein a ratio (adhesive layer/base material) between a linear expansion coefficient of the first base material and a linear expansion coefficient of the adhesive layer is from 0.7 to 1.8.

Advantageous Effects of Invention

According to the present invention, the transport fixing jig that has a high gripping force, hardly contaminates an object to be processed (object to be transported), and is excellent in heat resistance can be provided. In more detail, the transport fixing jig of the present invention includes the carbon nanotube aggregate arranged on the first base material, and hence can fix the object to be processed with the carbon nanotube aggregate. Accordingly, the transport fixing jig has a high gripping force, hardly contaminates the object to be processed (object to be transported), and is excellent in heat resistance. Further, when the first base material and the carbon nanotube aggregate are bonded to each other via the adhesive layer, and the ratio (adhesive layer/base material) between the linear expansion coefficient of the first base material and the linear expansion coefficient of the adhesive layer is set within a specific range, even under high temperature, the carbon nanotube aggregate hardly desorbs, and hence the object to be processed (object to be transported) can be satisfactorily fixed.

DESCRIPTION OF EMBODIMENTS

A. Outline of Transport Fixing Jig

Figure 1:
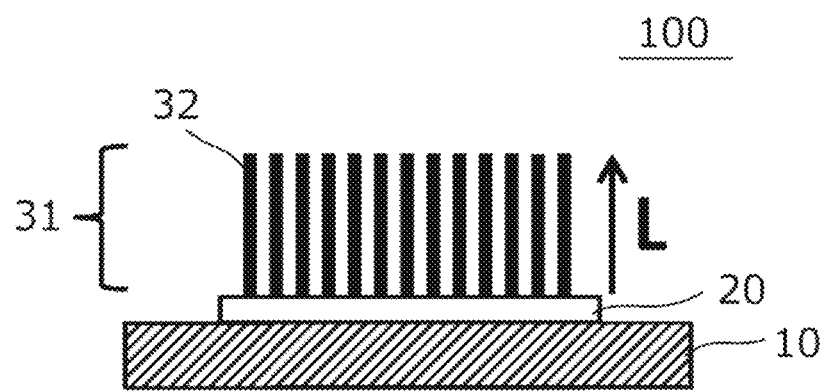
FIG. 1 is a schematic sectional view of a transport fixing jig according to one embodiment of the present invention.

FIG. 1 is a schematic sectional view of a transport fixing jig according to one embodiment of the present invention. A transport fixing jig 100 includes: a first base material 10; a carbon nanotube aggregate 31; and an adhesive layer 20 arranged between the first base material 10 and the carbon nanotube aggregate 31. The first base material 10 and the carbon nanotube aggregate 31 are bonded to each other via the adhesive layer 20. The carbon nanotube aggregate 31 may be arranged on the entire surface of the first base material 10, or may be arranged on part of the surface of the first base material 10.

The carbon nanotube aggregate 31 includes a plurality of carbon nanotubes 32. The carbon nanotubes 32 are each aligned in the direction of a length L, and the carbon nanotube aggregate 31 is formed as a fibrous columnar structure. The carbon nanotubes are each preferably aligned in a direction substantially perpendicular to the first base material 10. The term "direction substantially perpendicular" as used herein means that an angle relative to the surface of the base material 10 is preferably 90°±20°, more preferably 90°±15°, still more preferably 90°±10°, particularly preferably 90°+5°.

Figure 2:
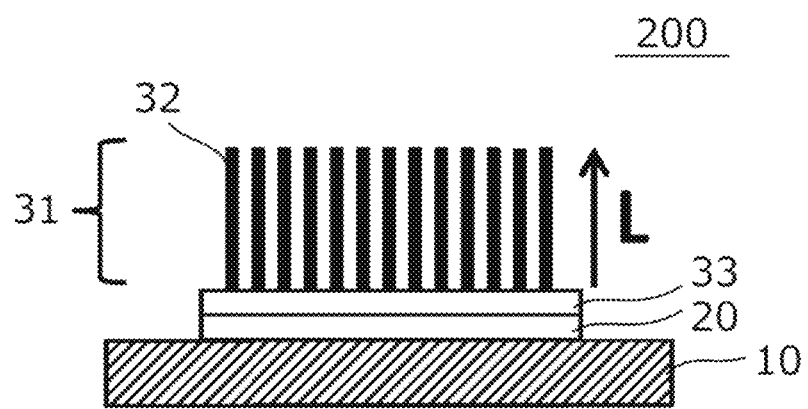
FIG. 2 is a schematic sectional view of a transport fixing jig according to another embodiment of the present invention.

FIG. 2 is a schematic sectional view of a transport fixing jig according to another embodiment of the present invention. In a transport fixing jig 200 of FIG. 2, the carbon nanotube aggregate 31 is formed on a second base material 33. The adhesive layer 20 is arranged on the side of the second base material 33 on which the carbon nanotube aggregate 31 is not formed. The first base material 10 and the second base material 33 are bonded to each other via the adhesive layer 20.

The transport fixing jig of the present invention can be suitably used in, for example, a manufacturing process for a semiconductor device or a manufacturing process for an optical member. In more detail, in the manufacturing process for a semiconductor device, the transport fixing jig of the present invention can be used for transporting a material, a production intermediate, a product, or the like (specifically, a semiconductor material, a wafer, a chip, a film, or the like) from one step to another or in a predetermined step. Alternatively, in the manufacturing process for an optical member, the transport fixing jig of the present invention may be used for transporting a glass base material or the like from one step to another or in a predetermined step. A material, a production intermediate, a product, or the like that can be transported by the transport fixing jig of the present invention is hereinafter sometimes referred to as "object to be processed" or "object to be transported."

The coefficient of static friction of the carbon nanotube aggregate-side surface of the transport fixing jig against a glass surface at 23° C. is preferably 1.0 or more. An upper limit value for the coefficient of static friction is preferably 50. When the coefficient of static friction falls within such range, a transport fixing jig excellent in gripping property can be obtained. Needless to say, the transport fixing jig having a large coefficient of friction against the glass surface can express a strong gripping property also against an object to be mounted (e.g., a semiconductor wafer) including a material except glass.

B. First Base Material

Figure 3:
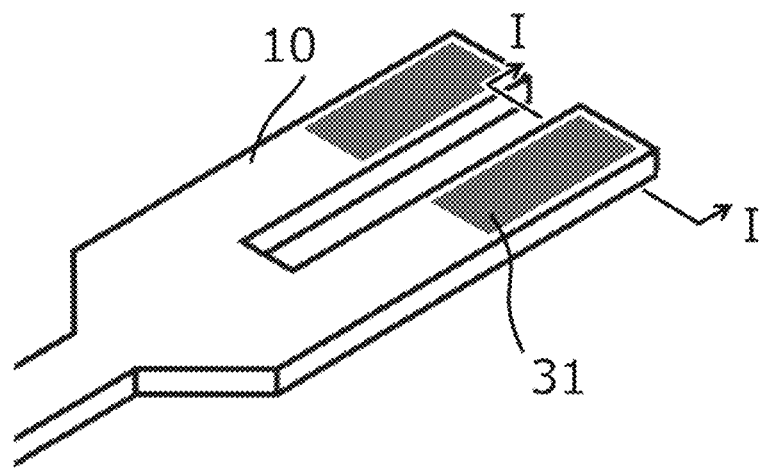
FIG. 3 is a schematic perspective view of the transport fixing jig according to one embodiment of the present invention.

The first base material functions as a carrying member at the time of the transport of, for example, a semiconductor material or an electronic material. Examples of the form of the first base material include a transport arm, a transport table, a transport ring, a transport guide rail, a storage cassette, a hook, and a transport frame. The size and shape of the first base material may be appropriately selected in accordance with purposes. The first base material may be part of, for example, a transport arm, a transport table, a transport ring, a transport guide rail, a storage cassette, a hook, or a transport frame. An example of a case in which the first base material is a transport arm is illustrated in the schematic perspective view of FIG. 3. In the transport fixing jig 100 of FIG. 3, the carbon nanotube aggregate 31 is arranged on one end of the first base material 10 serving as a transport arm. FIG. 1 described above is a sectional view taken along the line I-I of the transport fixing jig 100.

In addition, any appropriate material may be adopted as a material forming the first base material. In one embodiment, a ceramic material, such as alumina or silicon nitride, or a heat-resistant material, such as stainless steel, is used as the material forming the carrying member. Of those, alumina is preferably used.

The linear expansion coefficient of the first base material is preferably from 2 ppm/° C. to 12 ppm/° C., more preferably from 3 ppm/° C. to 12 ppm/° C., still more preferably from 5 ppm/° C. to 12 ppm/° C., even still more preferably from 6 ppm/° C. to 9 ppm/° C. When the linear expansion coefficient falls within such range, a transport fixing jig that can satisfactorily function even under high temperature can be obtained. Herein, the linear expansion coefficient may be measured with a thermomechanical analyzer (TMA).

The volume expansion coefficient of the first base material is preferably from 15 ppm/° C. to 36 ppm/° C., more preferably from 18 ppm/° C. to 27 ppm/° C. When the volume expansion coefficient falls within such range, a transport fixing jig that can satisfactorily function even under high temperature can be obtained.

A ratio (adhesive layer/base material) between the linear expansion coefficient of the first base material and the linear expansion coefficient of the adhesive layer is from 0.7 to 1.8. In the present invention, when the ratio between the linear expansion coefficients is set within such range, a transport fixing jig having the following feature can be obtained: even under high temperature (e.g., 450° C.), the carbon nanotube aggregate hardly desorbs, and hence an object to be processed (object to be transported) can be satisfactorily fixed. Great results of the present invention areas follows: the use of the carbon nanotube aggregate has achieved improvements in pressure-sensitive adhesive property and cleanliness of the transport fixing jig under high temperature; and appropriate adjustment of the linear expansion coefficient of the adhesive layer (ratio with respect to the linear expansion coefficient of the first base material) as described above has enabled satisfactory bonding of the carbon nanotube aggregate serving as an aggregate of fibrous materials to the first base material. The ratio (adhesive layer/base material) between the linear expansion coefficient of the first base material and the linear expansion coefficient of the adhesive layer is preferably from 0.8 to 1.7. When the ratio falls within such range, the above-mentioned effects become more significant.

C. Adhesive Layer

The adhesive layer may include any appropriate adhesive. An inorganic adhesive or a carbon-based adhesive is preferably used as an adhesive forming the adhesive layer. Those adhesives are preferred because the adhesives are each excellent in heat resistance. Of those, an inorganic adhesive or a carbon-based adhesive is preferred.

Examples of the inorganic adhesive include a ceramic adhesive and a silica-based adhesive.

The ceramic adhesive is an adhesive that can express an adhesive property through the curing of a curable component, such as an alkali metal silicate, a phosphate, or a metal alkoxide. A ceramic adhesive containing an alkali metal silicate or a phosphate (e.g., aluminum phosphate) as a curable component is preferably used.

The silica-based adhesive is an adhesive that can express an adhesive property through the curing of a silica-based curable component, such as silicic anhydride fine particles each including a silanol group on its surface or organopolysiloxane. For example, a silicone-based material, such as molten silica, ultrafine particulate silica (e.g., particle diameter: 10 nm to 100 nm), organopolysiloxane, a silane compound, or an organosilicon compound, may be used as the silica-based curable component.

The ceramic adhesive and the silica-based adhesive may each further contain a curing agent (curing accelerator) and/or a filler. In addition, the ceramic adhesive may contain any appropriate dispersion medium.

Examples of the curing agent (curing accelerator) to be used in combination with the alkali metal silicate in the ceramic adhesive include: oxides or hydroxides of zinc, magnesium, and calcium; silicides of sodium, potassium, and calcium; phosphates of aluminum and zinc; and borates of calcium, barium, and magnesium. Examples of the curing agent (curing accelerator) to be used in combination with the phosphate include: oxides or hydroxides of magnesium, calcium, zinc, and aluminum; silicates of magnesium and calcium; and Group II borates.

Examples of the filler include alumina, silica, zirconia, and magnesium oxide. In one embodiment, the linear expansion coefficient of the adhesive layer is adjusted by the kind and/or addition amount of the filler.

Any appropriate solvent is used as the dispersion medium. An aqueous solvent may be used as the solvent, or an organic solvent may be used. The aqueous solvent is preferred because an adhesive layer having higher heat resistance can be formed. In addition, the organic solvent is preferred because of its excellent affinity for the carbon nanotube aggregate.

A component in the ceramic adhesive may be appropriately selected in accordance with, for example, the material forming the first base material, a material forming the second base material, and a desired heat-resistant temperature. In one embodiment, when the first base material includes alumina, a metal alkoxide is used as the curable component, alumina is used as the filler, and an alcohol, such as methanol, is used as the dispersion medium.

In one embodiment, the carbon-based adhesive contains a binder, a carbon-based filler, and a solvent. Examples of the binder include an alkali metal silicate, a phosphate, and a metal alkoxide. Of those, an alkali metal silicate is preferred. Examples of the carbon-based filler include graphite powder and carbon black. Of those, carbon black is preferred. The solvent is, for example, water.

In another embodiment, the carbon-based adhesive may contain a predetermined resin and a carbon-based filler. A resin that is turned into non-graphitizable carbon by heating may be used as the resin. Examples of such resin include a phenol resin and a polycarbodiimide resin. Examples of the carbon-based filler include graphite powder and carbon black. In addition, the carbon-based adhesive may contain any appropriate solvent. Examples of the solvent in the carbon-based adhesive include water, phenol, formaldehyde, and ethanol.

The linear expansion coefficient of the adhesive layer is preferably from 5 ppm/° C. to 12 ppm/° C., more preferably from 6 ppm/° C. to 9 ppm/° C. When the linear expansion coefficient falls within such range, a transport fixing jig from which the carbon nanotube aggregate hardly desorbs even under high temperature can be obtained. The linear expansion coefficient of the adhesive layer is a linear expansion coefficient after the curing of the adhesive.

The volume expansion coefficient of the adhesive layer is preferably from 15 ppm/° C. to 36 ppm/° C., more preferably from 18 ppm/° C. to 27 ppm/° C. When the volume expansion coefficient falls within such range, a transport fixing jig from which the carbon nanotube aggregate hardly desorbs even under high temperature can be obtained. The volume expansion coefficient of the adhesive layer is a volume expansion coefficient after the curing of the adhesive.

When the transport fixing jig is left to stand under 450° C. for 1 hour, a change in modulus of elasticity of the adhesive layer {(modulus of elasticity of adhesive layer after 450° C.×1 hour)−(modulus of elasticity of adhesive layer immediately after formation of adhesive layer (immediately after curing of adhesive))} is preferably 50% or less, more preferably 30% or less. When an adhesive layer showing such a small characteristic change under high temperature is formed, a transport fixing jig from which the carbon nanotube aggregate hardly desorbs even under high temperature can be obtained. The modulus of elasticity may be determined by single indentation measurement with a nanoindenter from the slope of a load-displacement curve and the area of the indenter projected on the sample. Measurement conditions for the single indentation measurement with the nanoindenter are as described below.

Apparatus: Triboindenter manufactured by Hysitron, Inc.
Used indenter: Berkovich (triangular pyramid type)
Measurement method: Single indentation measurement
Measurement temperature: 25° C. (room temperature)
Indentation depth setting: 5 μm The thickness of the adhesive layer is preferably from 0.1 μm to 100 μm, more preferably from 0.5 μm to 50 μm, still more preferably from 1.0 μm to 20 μm. When the thickness falls within such range, the carbon nanotube aggregate or the second base material and the first base material can be strongly bonded to each other via the adhesive layer.

D. Carbon Nanotube Aggregate

The carbon nanotube aggregate includes a plurality of carbon nanotubes.

The length of each of the carbon nanotubes is preferably from 50 μm to 3,000 μm, more preferably from 200 μm to 2,000 μm, still more preferably from 300 μm to 1,500 μm, particularly preferably from 400 μm to 1,000 μm, most preferably from 500 μm to 1,000 μm. When the length falls within such range, a transport fixing jig that has a high gripping force and hardly contaminates an object to be transported can be formed.

For the carbon nanotube aggregate, for example, the following embodiments (a first embodiment and a second embodiment) may be adopted.

A first embodiment of the carbon nanotube aggregate includes a plurality of carbon nanotubes, in which the carbon nanotubes each have a plurality of walls, the distribution width of the wall number distribution of the carbon nanotubes is 10 walls or more, and the relative frequency of the mode of the wall number distribution is 25% or less. When the carbon nanotube aggregate has such configuration, a transport fixing jig that has a high gripping force and hardly contaminates an object to be transported can be formed.

In the first embodiment, the distribution width of the wall number distribution of the carbon nanotubes is preferably 10 walls or more, more preferably from 10 walls to 30 walls, still more preferably from 10 walls to 25 walls, particularly preferably from 10 walls to 20 walls. When the distribution width of the wall number distribution of the carbon nanotubes is adjusted to fall within such range, a transport fixing jig that has a high gripping force and hardly contaminates an object to be transported can be formed.

The "distribution width" of the wall number distribution of the carbon nanotubes refers to a difference between the maximum wall number and minimum wall number of the wall numbers of the carbon nanotubes. When the distribution width of the wall number distribution of the carbon nanotubes is adjusted to fall within the above-mentioned range, the carbon nanotubes can have both excellent mechanical properties and a high specific surface area, and moreover, the carbon nanotubes can provide a carbon nanotube aggregate exhibiting an excellent pressure-sensitive adhesive property.

The wall number and wall number distribution of the carbon nanotubes may each be measured with any appropriate device. The wall number and wall number distribution of the carbon nanotubes are each preferably measured with a scanning electron microscope (SEM) or a transmission electron microscope (TEM). For example, at least 10, preferably 20 or more carbon nanotubes may be taken out from the carbon nanotube aggregate to evaluate the wall number and the wall number distribution by the measurement with the SEM or the TEM.

In the first embodiment, the maximum wall number of the wall numbers of the carbon nanotubes is preferably from 5 to 30, more preferably from 10 to 30, still more preferably from 15 to 30, particularly preferably from 15 to 25. When the maximum wall number of the wall numbers of the carbon nanotubes is adjusted to fall within such range, a transport fixing jig that has a high gripping force and hardly contaminates an object to be transported can be formed.

In the first embodiment, the minimum wall number of the wall numbers of the carbon nanotubes is preferably from 1 to 10, more preferably from 1 to 5. When the minimum wall number of the wall numbers of the carbon nanotubes is adjusted to fall within such range, a transport fixing jig that has a high gripping force and hardly contaminates an object to be transported can be formed.

In the first embodiment, when the maximum wall number and minimum wall number of the wall numbers of the carbon nanotubes are adjusted to fall within the above-mentioned ranges, the carbon nanotubes can have both excellent mechanical properties and a high specific surface area, and moreover, the carbon nanotubes can provide a carbon nanotube aggregate exhibiting an excellent pressure-sensitive adhesive property.

In the first embodiment, the relative frequency of the mode of the wall number distribution of the carbon nanotubes is preferably 25% or less, more preferably from 1% to 25%, still more preferably from 5% to 25%, particularly preferably from 10% to 25%, most preferably from 15% to 25%. When the relative frequency of the mode of the wall number distribution of the carbon nanotubes is adjusted to fall within the above-mentioned range, the carbon nanotubes can have both excellent mechanical properties and a high specific surface area, and moreover, the carbon nanotubes can provide a carbon nanotube aggregate exhibiting an excellent pressure-sensitive adhesive property.

In the first embodiment, the mode of the wall number distribution of the carbon nanotubes is present at preferably from 2 walls to 10 walls in number, more preferably from 3 walls to 10 walls in number. When the mode of the wall number distribution of the carbon nanotubes is adjusted to fall within the above-mentioned range, the carbon nanotubes can have both excellent mechanical properties and a high specific surface area, and moreover, the carbon nanotubes can provide a carbon nanotube aggregate exhibiting an excellent pressure-sensitive adhesive property.

In the first embodiment, regarding the shape of each of the carbon nanotubes, the lateral section of the carbon nanotube only needs to have any appropriate shape. The lateral section is of, for example, a substantially circular shape, an oval shape, or an n-gonal shape (n represents an integer of 3 or more).

In the first embodiment, the length of each of the carbon nanotubes is preferably 50 μm or more, more preferably from 100 μm to 3,000 μm, still more preferably from 300 μm to 1,500 μm, even still more preferably from 400 μm to 1,000 μm, particularly preferably from 500 μm to 1,000 μm. When the length of each of the carbon nanotubes is adjusted to fall within the above-mentioned range, the carbon nanotubes can have both excellent mechanical properties and a high specific surface area, and moreover, the carbon nanotubes can provide a carbon nanotube aggregate exhibiting an excellent pressure-sensitive adhesive property.

In the first embodiment, the diameter of each of the carbon nanotubes is preferably from 0.3 nm to 2,000 nm, more preferably from 1 nm to 1,000 nm, still more preferably from 2 nm to 500 nm. When the diameter of each of the carbon nanotubes is adjusted to fall within the above-mentioned range, the carbon nanotubes can have both excellent mechanical properties and a high specific surface area, and moreover, the carbon nanotubes can provide a carbon nanotube aggregate exhibiting an excellent pressure-sensitive adhesive property.

In the first embodiment, the specific surface area and density of each of the carbon nanotubes may be set to any appropriate values.

The second embodiment of the carbon nanotube aggregate includes a plurality of carbon nanotubes, in which the carbon nanotubes each have a plurality of walls, the mode of the wall number distribution of the carbon nanotubes is present at 10 walls or less in number, and the relative frequency of the mode is 30% or more. When the carbon nanotube aggregate has such configuration, a transport fixing jig that has a high gripping force and hardly contaminates an object to be transported can be formed.

In the second embodiment, the distribution width of the wall number distribution of the carbon nanotubes is preferably 9 walls or less, more preferably from 1 wall to 9 walls, still more preferably from 2 walls to 8 walls, particularly preferably from 3 walls to 8 walls. When the distribution width of the wall number distribution of the carbon nanotubes is adjusted to fall within such range, a transport fixing jig that has a high gripping force and hardly contaminates an object to be transported can be formed.

In the second embodiment, the maximum wall number of the wall numbers of the carbon nanotubes is preferably from 1 to 20, more preferably from 2 to 15, still more preferably from 3 to 10. When the maximum wall number of the wall numbers of the carbon nanotubes is adjusted to fall within such range, a transport fixing jig that has a high gripping force and hardly contaminates an object to be transported can be formed.

In the second embodiment, the minimum wall number of the wall numbers of the carbon nanotubes is preferably from 1 to 10, more preferably from 1 to 5. When the minimum wall number of the wall numbers of the carbon nanotubes is adjusted to fall within such range, a transport fixing jig that has a high gripping force and hardly contaminates an object to be transported can be formed.

In the second embodiment, when the maximum wall number and minimum wall number of the wall numbers of the carbon nanotubes are adjusted to fall within the above-mentioned ranges, the carbon nanotubes can have both excellent mechanical properties and a high specific surface area, and moreover, the carbon nanotubes can provide a carbon nanotube aggregate exhibiting an excellent pressure-sensitive adhesive property.

In the second embodiment, the relative frequency of the mode of the wall number distribution of the carbon nanotubes is preferably 30% or more, more preferably from 30% to 100%, still more preferably from 30% to 90%, particularly preferably from 30% to 80%, most preferably from 30% to 70%. When the relative frequency of the mode of the wall number distribution of the carbon nanotubes is adjusted to fall within the above-mentioned range, the carbon nanotubes can have both excellent mechanical properties and a high specific surface area, and moreover, the carbon nanotubes can provide a carbon nanotube aggregate exhibiting an excellent pressure-sensitive adhesive property.

In the second embodiment, the mode of the wall number distribution of the carbon nanotubes is present at preferably 10 walls or less in number, more preferably from 1 wall to 10 walls in number, still more preferably from 2 walls to 8 walls in number, particularly preferably from 2 walls to 6 walls in number. When the mode of the wall number distribution of the carbon nanotubes is adjusted to fall within the above-mentioned range, the carbon nanotubes can have both excellent mechanical properties and a high specific surface area, and moreover, the carbon nanotubes can provide a carbon nanotube aggregate exhibiting an excellent pressure-sensitive adhesive property.

In the second embodiment, regarding the shape of each of the carbon nanotubes, the lateral section of the carbon nanotube only needs to have any appropriate shape. The lateral section is of, for example, a substantially circular shape, an oval shape, or an n-gonal shape (n represents an integer of 3 or more).

In the second embodiment, the length of each of the carbon nanotubes is preferably 50 µm or more, more preferably from 550 µm to 3,000 µm, still more preferably from 600 µm to 2,000 µm, even still more preferably from 650 µm to 1,000 µm, particularly preferably from 700 µm to 1,000 µm. When the length of each of the carbon nanotubes is adjusted to fall within the above-mentioned range, the carbon nanotubes can have both excellent mechanical properties and a high specific surface area, and moreover, the carbon nanotubes can provide a carbon nanotube aggregate exhibiting an excellent pressure-sensitive adhesive property.

In the second embodiment, the diameter of each of the carbon nanotubes is preferably from 0.3 nm to 2,000 nm, more preferably from 1 nm to 1,000 nm, still more preferably from 2 nm to 500 nm. When the diameter of each of the carbon nanotubes is adjusted to fall within the above-mentioned range, the carbon nanotubes can have both excellent mechanical properties and a high specific surface area, and moreover, the carbon nanotubes can provide a carbon nanotube aggregate exhibiting an excellent pressure-sensitive adhesive property.

In the second embodiment, the specific surface area and density of the carbon nanotubes may be set to any appropriate values.

In one embodiment, at least part of the carbon nanotubes each have a portion including at least an end thereof covered with an inorganic material. The term "portion including at least an end" as used herein means a portion including at least an end of a carbon nanotube, that is, the end of the carbon nanotube on a side opposite to the first base material.

All of the carbon nanotubes may each have a portion including at least an end thereof covered with the inorganic material, or part of the carbon nanotubes may each have a portion including at least an end thereof covered with the inorganic material. The content of the carbon nanotubes each having a portion including at least an end thereof covered with the inorganic material in the entirety of the plurality of carbon nanotubes is preferably from 50 wt % to 100 wt %, more preferably from 60 wt % to 100 wt %, still more preferably from 70 wt % to 100 wt %, even still more preferably from 80 wt % to 100 wt %, particularly preferably from 90 wt % to 100 wt %, most preferably substantially 100 wt %. When the content falls within such range, a transport fixing jig that has a high gripping force and hardly contaminates an object to be transported can be formed.

The thickness of the covering layer is preferably 1 nm or more, more preferably 3 nm or more, still more preferably 5 nm or more, even still more preferably 7 nm or more, particularly preferably 9 nm or more, most preferably 10 nm or more. An upper limit value for the thickness of the covering layer is preferably 50 nm, more preferably 40 nm, still more preferably 30 nm, particularly preferably 20 nm, most preferably 15 nm. When the thickness falls within such range, a transport fixing jig that has a high gripping force and hardly contaminates an object to be transported can be formed.

The length of the covering layer is preferably from 1 nm to 1,000 nm, more preferably from 5 nm to 700 nm, still more preferably from 10 nm to 500 nm, particularly preferably from 30 nm to 300 nm, most preferably from 50 nm to 100 nm. When the length falls within such range, a transport fixing jig that has a high gripping force and hardly contaminates an object to be transported can be formed.

Any appropriate inorganic material may be adopted as the inorganic material to the extent that the effects of the present invention are not impaired. Examples of such inorganic material include $SiO_2$, $Al_2O_3$, $Fe_2O_3$, $TiO_2$, MgO, Cu, Ag, and Au.

Any appropriate method may be adopted as a method of producing the carbon nanotube aggregate.

The method of producing the carbon nanotube aggregate is, for example, a method of producing a carbon nanotube aggregate aligned substantially perpendicularly from a flat plate by chemical vapor deposition (CVD) involving forming a catalyst layer on the flat plate and filling a carbon source under a state in which a catalyst is activated with heat, plasma, or the like to grow the carbon nanotubes.

Any appropriate flat plate may be adopted as the flat plate that may be used in the method of producing the carbon nanotube aggregate. The flat plate is, for example, a material having smoothness and high-temperature heat resistance enough to resist the production of the carbon nanotubes. Examples of such material include quartz glass, silicon (such as a silicon wafer), and a metal plate made of, for example, aluminum.

Figure 4:
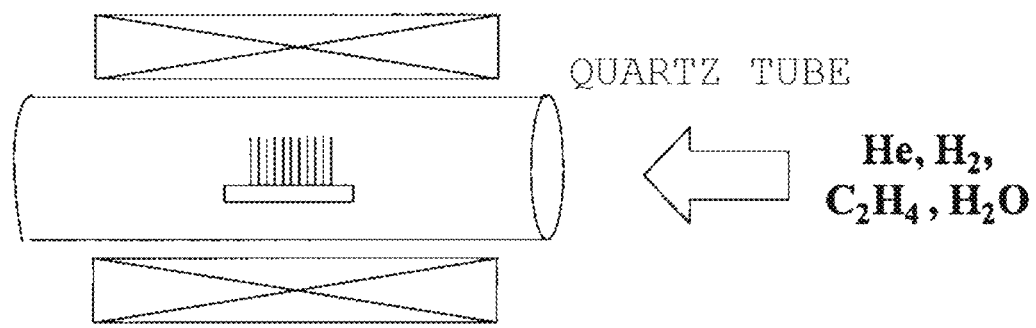
FIG. 4 is a schematic sectional view of a production apparatus for a carbon nanotube aggregate in one embodiment of the present invention.

Any appropriate apparatus may be adopted as an apparatus for producing the carbon nanotube aggregate. The apparatus is, for example, a thermal CVD apparatus of a hot wall type formed by surrounding a cylindrical reaction vessel with a resistance heating electric tubular furnace as illustrated in FIG. 4. In this case, for example, a heat-resistant quartz tube is preferably used as the reaction vessel.

Any appropriate catalyst may be used as the catalyst (material for the catalyst layer) that may be used in the production of the carbon nanotube aggregate. Examples of the catalyst include metal catalysts, such as iron, cobalt, nickel, gold, platinum, silver, and copper.

In the production of the carbon nanotube aggregate, an alumina/hydrophilic film may be formed between the flat plate and the catalyst layer as required.

Any appropriate method may be adopted as a method of producing the alumina/hydrophilic film. For example, the film is obtained by producing a $SiO_2$ film on the flat plate, depositing Al from the vapor, and then increasing the temperature of Al to 450° C. to oxidize Al. According to such production method, $Al_2O_3$ interacts with the hydrophilic $SiO_2$ film, and hence an $Al_2O_3$ surface different from that obtained by directly depositing $Al_2O_3$ from the vapor in particle diameter is formed. When Al is deposited from the vapor, and then its temperature is increased to 450° C. so that Al may be oxidized without the production of any hydrophilic film on the flat plate, it may be difficult to form the $Al_2O_3$ surface having a different particle diameter. In addition, when the hydrophilic film is produced on the flat plate and $Al_2O_3$ is directly deposited from the vapor, it may also be difficult to form the $Al_2O_3$ surface having a different particle diameter.

The thickness of the catalyst layer that may be used in the production of the carbon nanotube aggregate is preferably from 0.01 nm to 20 nm, more preferably from 0.1 nm to 10 nm in order to form fine particles. When the thickness of the catalyst layer that may be used in the production of the carbon nanotube aggregate is adjusted to fall within the above-mentioned range, the carbon nanotubes to be formed can have both excellent mechanical properties and a high specific surface area, and moreover, the carbon nanotubes can provide a carbon nanotube aggregate exhibiting an excellent pressure-sensitive adhesive property.

Any appropriate method may be adopted as a method of forming the catalyst layer. Examples of the method include a method involving depositing a metal catalyst from the vapor, for example, with an electron beam (EB) or by sputtering and a method involving applying a suspension of metal catalyst fine particles onto the flat plate.

Any appropriate carbon source may be used as the carbon source that may be used in the production of the carbon nanotube aggregate. Examples thereof include: hydrocarbons, such as methane, ethylene, acetylene, and benzene; and alcohols, such as methanol and ethanol.

Any appropriate temperature may be adopted as a production temperature in the production of the carbon nanotube aggregate. For example, the temperature is preferably from 400° C. to 1,000° C., more preferably from 500° C. to 900° C., still more preferably from 600° C. to 800° C. in order that catalyst particles allowing sufficient expression of the effect of the present invention may be formed.

E. Second Base Material

The second base material may be a flat plate used at the time of the formation of the carbon nanotube aggregate. That is, the transport fixing jig including the second base material is obtained by laminating a flat plate having formed thereon the carbon nanotube aggregate as it is on the first base material.

F. Method of Producing Transport Fixing Jig

The transport fixing jig may be produced by any appropriate method. In one embodiment, the transport fixing jig may be obtained by: applying the adhesive forming the adhesive layer onto the first base material; arranging the carbon nanotube aggregate on an applied layer formed by the application; and then curing the applied layer to form the adhesive layer. A method of arranging the carbon nanotube aggregate on the applied layer is, for example, a method involving transferring the carbon nanotube aggregate from the flat plate with a carbon nanotube aggregate obtained by the method described in the section D onto the applied layer.

In another embodiment, the transport fixing jig may be obtained by: applying the adhesive forming the adhesive layer onto the first base material; laminating the flat plate (second base material) having formed thereon the carbon nanotube aggregate on an applied layer formed by the application; and then curing the applied layer.

Any appropriate method may be adopted as a method of applying the adhesive. Examples of the application method include application with a comma coater or a die coater, application with a dispenser, and application with a squeegee.

Any appropriate method may be adopted as a method of curing the applied layer of the adhesive. A method involving curing the layer through heating is preferably used. A curing temperature may be appropriately set in accordance with the kind of the adhesive. The curing temperature is, for example, from 90° C. to 400° C. In one embodiment, when a carbon-based adhesive is used as the adhesive, the adhesive is calcined under high temperature after its curing. A calcination temperature is preferably higher than the use temperature of the adhesive, and is, for example, from 350° C. to 3,000° C.

EXAMPLES

Now, the present invention is described by way of Examples. However, the present invention is not limited thereto. Various evaluations and measurements were performed by the following methods.

[Production Example 1] Production of Carbon Nanotube Aggregate

An $Al_2O_3$ thin film (ultimate vacuum: $8.0 \times 10^{-4}$ Pa, sputtering gas: Ar, gas pressure: 0.50 Pa, growth rate: 0.12 nm/sec, thickness: 20 nm) was formed on a flat plate made of silicon (manufactured by Valqua FFT Inc., thickness: 700 µm) with a sputtering apparatus (manufactured by Shibaura Mechatronics Corporation, product name: "CFS-4ES"). An Fe thin film was further formed as a catalyst layer (sputtering gas: Ar, gas pressure: 0.75 Pa, growth rate: 0.012 nm/sec, thickness: 1.0 nm) on the $Al_2O_3$ thin film with a sputtering apparatus (manufactured by Shibaura Mechatronics Corporation, product name: "CFS-4ES").

After that, the flat plate was placed in a quartz tube of 30 mmφ, and a helium/hydrogen (105/80 sccm) mixed gas having its moisture content kept at 700 ppm was flowed into the quartz tube for 30 minutes to replace the inside of the tube. After that, the temperature in the tube was increased with an electric tubular furnace to 765° C. and stabilized at 765° C. While the temperature was kept at 765° C., the inside of the tube was filled with a helium/hydrogen/ethylene (105/80/15 sccm, moisture content: 700 ppm) mixed gas, and the resultant was left to stand for 60 minutes to form a carbon nanotube aggregate on the flat plate.

Example 1

An adhesive (manufactured by ThreeBond Co., Ltd., product name: "TB3732," binder: metal alkoxide, filler: alumina) was applied onto a first base material (made of ceramics; linear expansion coefficient: 8 ppm/° C.) with a squeegee.

The carbon nanotube aggregate obtained in Production Example 1 was collected from the flat plate, and was arranged on the applied layer of the adhesive. At this time, the arrangement was performed so that the side of the carbon nanotube aggregate that had been in contact with the flat plate was brought into contact with the applied layer of the adhesive.

After that, a weight was placed on the side of the carbon nanotube aggregate opposite to the applied layer of the adhesive via a clean wafer, and a load of 50 g/cm² was applied for 1 minute to bring the carbon nanotube aggregate and the applied layer of the adhesive into close contact with each other.

Next, a laminate obtained as described above was placed under normal temperature for 1 hour and under an environment at 100° C. for 30 minutes to cure the adhesive.

A transport fixing jig including the first base material, the adhesive layer (thickness: 10 µm), and the carbon nanotube aggregate was obtained as described above.

Example 2

A laminate was obtained in the same manner as in Example 1 except that an adhesive (manufactured by EM Japan Co., Ltd., product name: "G7716," binder: silicate, filler: carbon) was used instead of the adhesive (manufactured by ThreeBond Co., Ltd., product name: "TB3732," binder: metal alkoxide, filler: alumina). The laminate was placed under normal temperature for 2 hours and under an environment at 100° C. for 2 hours to cure the adhesive. Thus, a transport fixing jig including the first base material, the adhesive layer (thickness: 10 µm), and the carbon nanotube aggregate was obtained.

Example 3

A laminate was obtained in the same manner as in Example 1 except that an adhesive (manufactured by AIN Co., Ltd., product name: "RG-57-2-3;" binder: organopolysiloxane, fillers: silicon dioxide (silica), titanium dioxide (titania), and potassium titanate, solvent: ethylene glycol dibutyl ether) was used instead of the adhesive (manufactured by ThreeBond Co., Ltd., product name: "TB3732," binder: metal alkoxide, filler: alumina). The laminate was placed under an environment at 80° C. for 30 minutes, under an environment at 150° C. for 30 minutes, and under an environment at 400° C. for 2 hours to cure and calcine the adhesive. Thus, a transport fixing jig including the first base material, the adhesive layer (thickness: 20 µm), and the carbon nanotube aggregate was obtained.

Example 4

A laminate was obtained in the same manner as in Example 1 except that: a first base material (made of ceramics; linear expansion coefficient: 3 ppm/° C.) was used instead of the first base material (made of ceramics; linear expansion coefficient: 8 ppm/° C.); and an adhesive (manufactured by AIN Co., Ltd., product name: "RG-12-6-2;" binder: organopolysiloxane, fillers: silicon dioxide (silica) and titanium dioxide (titania), solvent: ethylene glycol monobutyl ether) was used instead of the adhesive (manufactured by ThreeBond Co., Ltd., product name: "TB3732," binder: metal alkoxide, filler: alumina). The laminate was placed under an environment at 80° C. for 30 minutes, under an environment at 150° C. for 30 minutes, and under an environment at 400° C. for 2 hours to cure and calcine the adhesive. Thus, a transport fixing jig including the first base material, the adhesive layer (thickness: 20 µm), and the carbon nanotube aggregate was obtained.

Comparative Example 1

A laminate was obtained in the same manner as in Example 1 except that an adhesive (manufactured by Toagosei Co., Ltd., product name: "ARON CERAMIC C," binder: silicate, filler: silica) was used instead of the adhesive (manufactured by ThreeBond Co., Ltd., product name: "TB3732," binder: metal alkoxide, filler: alumina). The laminate was placed under normal temperature for 24 hours, under an environment at 90° C. for 2 hours, and under an environment at 150° C. for 1 hour to cure the adhesive. Thus, a transport fixing jig including the first base material, the adhesive layer (thickness: 10 µm), and the carbon nanotube aggregate was obtained.

Comparative Example 2

A laminate was obtained in the same manner as in Example 1 except that an adhesive (manufactured by Toagosei Co., Ltd., product name: "ARON CERAMIC E," binder: silicate, fillers: zirconia and silica) was used instead of the adhesive (manufactured by ThreeBond Co., Ltd., product name: "TB3732," binder: metal alkoxide, filler: alumina). The laminate was placed under normal temperature for 24 hours, under an environment at 90° C. for 2 hours, and under an environment at 150° C. for 1 hour to cure the adhesive. Thus, a transport fixing jig including the first base material, the adhesive layer (thickness: 10 µm), and the carbon nanotube aggregate was obtained.

[Evaluation]

The transport fixing jigs obtained in Examples and Comparative Examples were subjected to the following evaluations. The results are shown in Table 1.

(1) Linear Expansion Coefficient

A linear expansion coefficient was measured with a thermomechanical analyzer (TMA) (manufactured by Shimadzu Corporation, "TMA-60").

(2) Adhesive Strength

An adhesive strength (tensile shear strength) between the first base material and carbon nanotube aggregate of a transport fixing jig immediately after its production under room temperature (23° C.) was measured. The adhesive strength was measured with an autograph (manufactured by Shimadzu Corporation, product name: "Shimadzu Autograph AG-120 kN") at a tensile rate of 50 ram/min.

In addition, the adhesive strength of the transport fixing jig after high-temperature treatment (at 450° C. for 1 hour) was measured by the same method as that described above.

TABLE 1

|  |  | Example 1 | Example 2 | Example 3 | Example 4 | Comparative Example 1 | Comparative Example 2 |
|---|---|---|---|---|---|---|---|
| Adhesive | Product name | TB3732 | G7716 | RG57-2-3 | RG12-6-2 | ARON CERAMIC C | ARON CERAMIC E |
|  | Binder | Metal alkoxide | Silicate | Organopolysiloxane | Organopolysiloxane | Silicate | Silicate |
|  | Filler | Alumina | Carbon | Silica, titania, and potassium titanate | Silica and titania | Silica | Zirconia and silica |
| Linear expansion coefficient of adhesive layer (ppm/° C.) |  | 8 | 6 | 6 | 5 | 15 | 4 |
| Linear expansion coefficient of first base material (ppm/° C.) |  | 8 | 8 | 8 | 3 | 8 | 8 |
| Ratio between linear expansion coefficients Adhesive layer/first base material |  | 1.0 | 0.8 | 0.8 | 1.7 | 1.9 | 0.5 |
| Adhesive strength (N/cm$^2$) |  | 8 | 4 | 27 | 21 | 6 | 8 |
| Adhesive strength after high-temperature treatment (N/cm$^2$) |  | 8 | 4 | 27 | 21 | 0.1 | 0.5 |

REFERENCE SIGNS LIST 10 first base material
20 adhesive layer
31 carbon nanotube aggregate
32 carbon nanotube
33 second base material
100, 200 transport fixing jig

The invention claimed is:

1. A transport fixing jig, comprising:
a first base material;
a carbon nanotube aggregate; and
an adhesive layer arranged between the first base material and the carbon nanotube aggregate,
wherein the first base material and the carbon nanotube aggregate are bonded to each other via the adhesive layer, and
wherein a ratio (adhesive layer/base material) between a linear expansion coefficient of the first base material and a linear expansion coefficient of the adhesive layer is from 0.7 to 1.8.

2. The transport fixing jig according to claim 1, further comprising a second base material,
wherein the carbon nanotube aggregate is formed on the second base material, and
wherein the first base material and the second base material are bonded to each other via the adhesive layer.

3. The transport fixing jig according to claim 1, wherein an adhesive forming the adhesive layer comprises an inorganic adhesive or a carbon-based adhesive.

4. The transport fixing jig according to claim 3, wherein the inorganic adhesive comprises a ceramic adhesive.

5. The transport fixing jig according to claim 1, wherein when the transport fixing jig is left to stand under 450° C. for 1 hour, a change in modulus of elasticity of the adhesive layer is 50% or less.

6. The transport fixing jig according to claim 1, wherein the adhesive layer has a linear expansion coefficient of from 5 ppm/° C. to 12 ppm/° C.

7. The transport fixing jig according to claim 1, wherein a material forming the first base material comprises alumina.

8. The transport fixing jig according to claim 1, wherein a surface of the carbon nanotube aggregate has a coefficient of static friction against a glass surface at 23° C. of from 1 to 50.

9. A method of producing a transport fixing jig of claim 1, comprising:
applying an adhesive onto a first base material to form an applied layer;
arranging a carbon nanotube aggregate on the applied layer;
curing the applied layer to form an adhesive layer; and
bonding the first base material and the carbon nanotube aggregate to each other via the adhesive layer,
wherein a ratio (adhesive layer/base material) between a linear expansion coefficient of the first base material and a linear expansion coefficient of the adhesive layer is from 0.7 to 1.8.

* * * * *